United States Patent
Sheridan

(10) Patent No.: US 10,777,673 B2
(45) Date of Patent: Sep. 15, 2020

(54) ASYMMETRICAL BLOCKING BIDIRECTIONAL GALLIUM NITRIDE SWITCH

(71) Applicant: Alpha and Omega Semiconductor incorporated, Sunnyvale, CA (US)

(72) Inventor: David Sheridan, Greensboro, NC (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

(21) Appl. No.: 16/428,746

(22) Filed: May 31, 2019

(65) Prior Publication Data

US 2019/0355844 A1 Nov. 21, 2019

Related U.S. Application Data

(62) Division of application No. 15/244,819, filed on Aug. 23, 2016, now abandoned.

(51) Int. Cl.
*H01L 29/778* (2006.01)
*H01L 29/66* (2006.01)
(Continued)

(52) U.S. Cl.
CPC ...... *H01L 29/7787* (2013.01); *H01L 29/2003* (2013.01); *H01L 29/205* (2013.01); *H01L 29/402* (2013.01); *H01L 29/404* (2013.01); *H01L 29/42356* (2013.01); *H01L 29/4966* (2013.01); *H01L 29/66462* (2013.01); *H01L 29/7786* (2013.01); *H01L 29/1066* (2013.01); *H01L 29/4236* (2013.01)

(58) Field of Classification Search
CPC .............. H01L 29/7787; H01L 29/402; H01L 29/66462; H01L 29/7786; H01L 29/4966; H01L 29/42356; H01L 29/404; H01L 29/205; H01L 29/2003; H01L 29/4236; H01L 29/1066; H01L 29/778–7789; H01L 29/66431; H01L 29/42316
See application file for complete search history.

(56) References Cited

U.S. PATENT DOCUMENTS

2005/0051800 A1* 3/2005 Mishra ................ H01L 27/0605
257/202
2012/0267687 A1* 10/2012 Jeon ....................... H01L 29/402
257/194

(Continued)

Primary Examiner — Hoang-Quan Ho
(74) Attorney, Agent, or Firm — Bo-In Lin

(57) ABSTRACT

A high electron mobility transistor (HEMT) gallium nitride (GaN) bidirectional blocking device includes a hetero-junction structure comprises a first semiconductor layer interfacing a second semiconductor layer of two different band gaps thus generating an interface layer as a two-dimensional electron gas (2DEG) layer. The HEMT GaN bidirectional blocking device further includes a first source/drain electrode and a second source/drain electrode disposed on two opposite sides of a gate electrode disposed on top of said hetero-junction structure for controlling a current flow between the first and second source/drain electrodes in the 2DEG layer wherein the gate electrode is disposed at a first distance from the first source/drain electrode and a second distance from the second source/drain electrode and the first distance is different from the second distance.

12 Claims, 20 Drawing Sheets

(51) Int. Cl.
*H01L 29/40* (2006.01)
*H01L 29/20* (2006.01)
*H01L 29/205* (2006.01)
*H01L 29/423* (2006.01)
*H01L 29/49* (2006.01)
*H01L 29/10* (2006.01)

(56) References Cited

U.S. PATENT DOCUMENTS

2013/0056753 A1* 3/2013 Simin .................... H01L 29/404
 257/77
2015/0171204 A1* 6/2015 Nakayama .......... H01L 29/0649
 257/20

* cited by examiner

ASYMMETRICAL BLOCKING BIDIRECTIONAL GALLIUM NITRIDE SWITCH

The present application claims the benefit of and priority to U.S. patent application Ser. No. 15/244,819, filed on Aug. 23, 2016 and entitled "ASYMMETRICAL BLOCKING BIDIRECTIONAL GALLIUM NITRIDE SWITCH." The disclosure of that application is hereby incorporated fully by reference into the present application.

BACKGROUND OF THE INVENTION

1. Field of the Invention

The invention relates generally to the configurations and methods of manufacturing the semiconductor devices. More particularly, this invention relates to an asymmetrical blocking gallium nitride (GaN) switch.

2. Description of the Prior Art

Conventional methods of configuring and manufacturing a gallium nitride (GaN) based field effect transistors (FETs) are still challenged with the technical issues for providing a bidirectional asymmetrical blocking capabilities to function as a bidirectional switch. It is often demanded to provide lateral GaN based asymmetrical blocking function for optimal applications in devices such as direct high voltage buck converter and dual boost bridgeless PFC.

Conventional methods of configuring and manufacturing a gallium nitride (GaN) based field effect transistors (FETs) are still challenged with the technical issues for providing a bidirectional asymmetrical blocking capabilities to function as a bidirectional switch. It is often demanded to provide lateral GaN based asymmetrical blocking function for optimal applications in devices such as direct high voltage buck converter and dual boost bridgeless PFC.

Therefore, there is a need to provide new and improved device configuration and manufacturing methods to make bidirectional GaN blocking switches with asymmetrical blocking capabilities to resolve the above mentioned limitations and difficulties.

SUMMARY OF THE PRESENT INVENTION

It is therefore an aspect of the present invention to provide a new and improved device configuration and manufacturing method to provide a high electron mobility transistor (HEMT) power device that provides the functions of asymmetrical bidirectional blocking switch such that the above discussed difficulties and limitations may be resolved.

Specifically, it is an aspect of the present invention to provide improved device configuration and method for manufacturing a semiconductor GaN-based HEMT power device with the functions of asymmetrical bidirectional blocking for applications to switch with asymmetrical voltage stress such that the Rds-on and the capacitive loss can be minimized thus reduce the unnecessary loss caused by symmetrical blocking switches commonly implemented in the conventional designs.

It is another aspect of the present invention to provide improved device configuration and method for manufacturing the GaN-based high electron mobility transistor (HEMT) power device with optimized lateral configuration for designing and manufacturing asymmetrical blocking switches such that commonly layout constraint that impose different parasitic inductances to cause asymmetrical blocking and asymmetrical voltage overshoots may be better considered and controlled as part of the design and manufacturing processes.

It is another aspect of the present invention to provide improved device configuration and method for manufacturing a semiconductor GaN-based HEMT power device with asymmetrical blocking capabilities with configurations by implementing either a single or dual gate configurations such that the switch functions and performances of the switching devices may be more flexible and conveniently controlled.

Briefly in a preferred embodiment this invention discloses a high electron mobility transistor (HEMT) gallium nitride (GaN) bidirectional blocking device that includes a hetero-junction structure comprising a first semiconductor layer interfacing a second semiconductor layer of two different band gaps thus generating an interface layer as a two-dimensional electron gas (2DEG) layer. The HEMT GaN bidirectional blocking device further includes a first source/drain electrode and a second source/drain electrode disposed on two opposite sides of a gate electrode disposed on top of the hetero-junction structure for controlling a current flow between the first and second source/drain electrodes in the 2DEG layer wherein the gate electrode is disposed at a first distance from the first source/drain electrode and a second distance from the second source/drain electrode and the first distance is different from the second distance.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
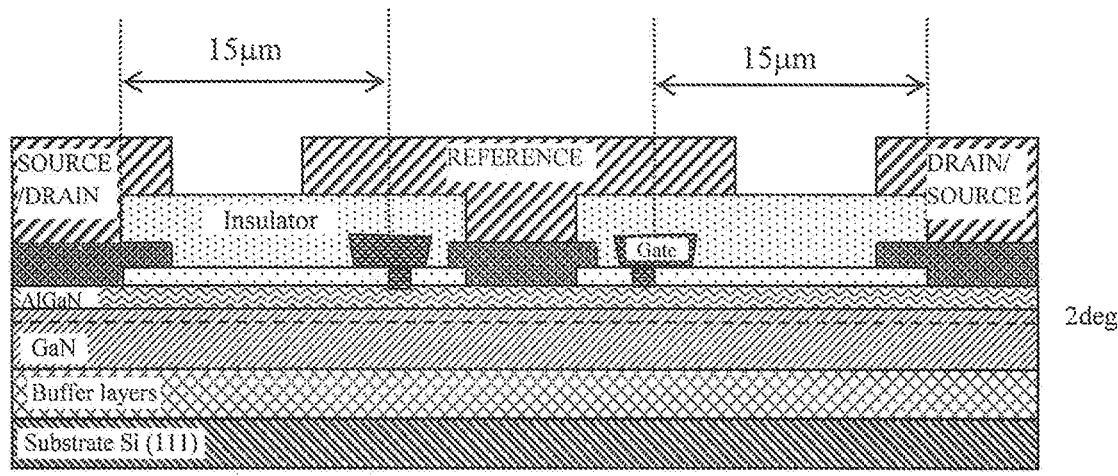
FIGS. 1A to 1E are cross sectional views and circuit diagrams to show a conventional GaN-based HEMT symmetrical blocking switching devices.
Figure 1B:
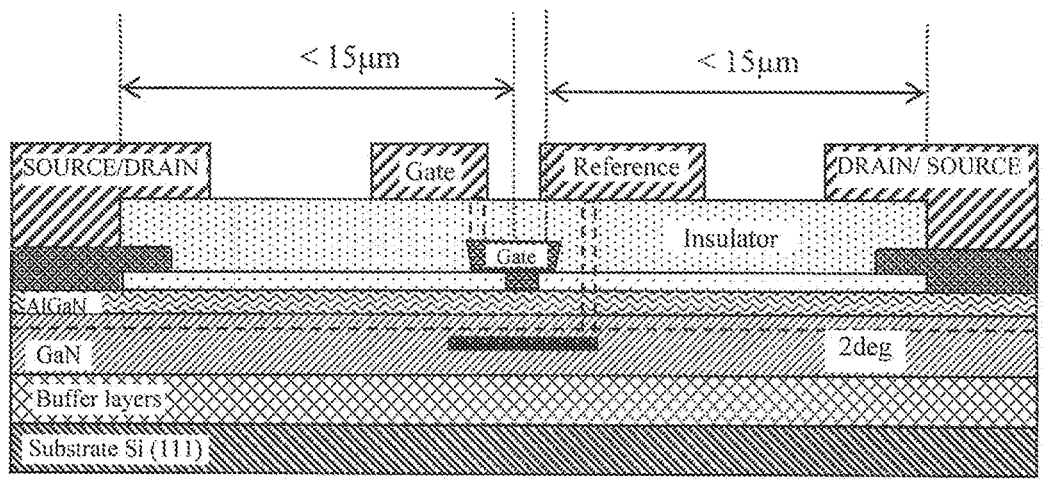
Figure 1C:
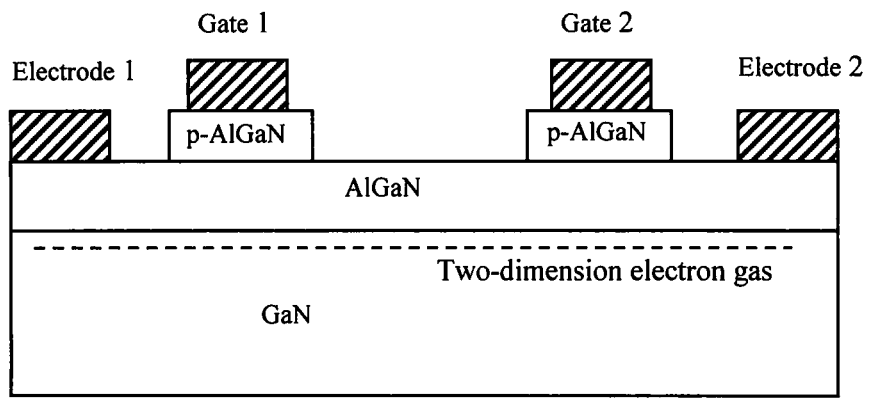
Figure 1D:
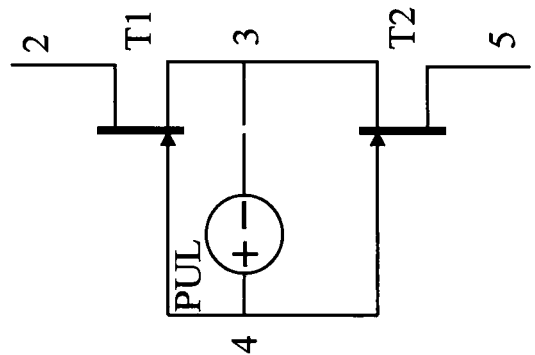
Figure 1E:
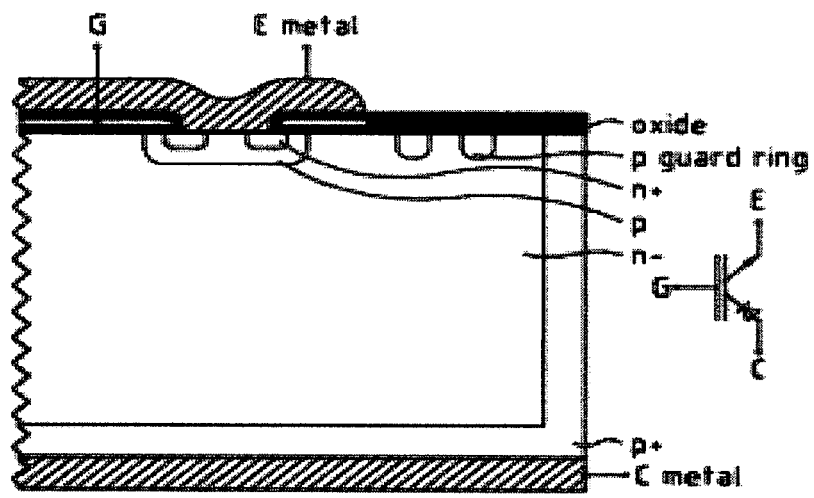
Figure 2:
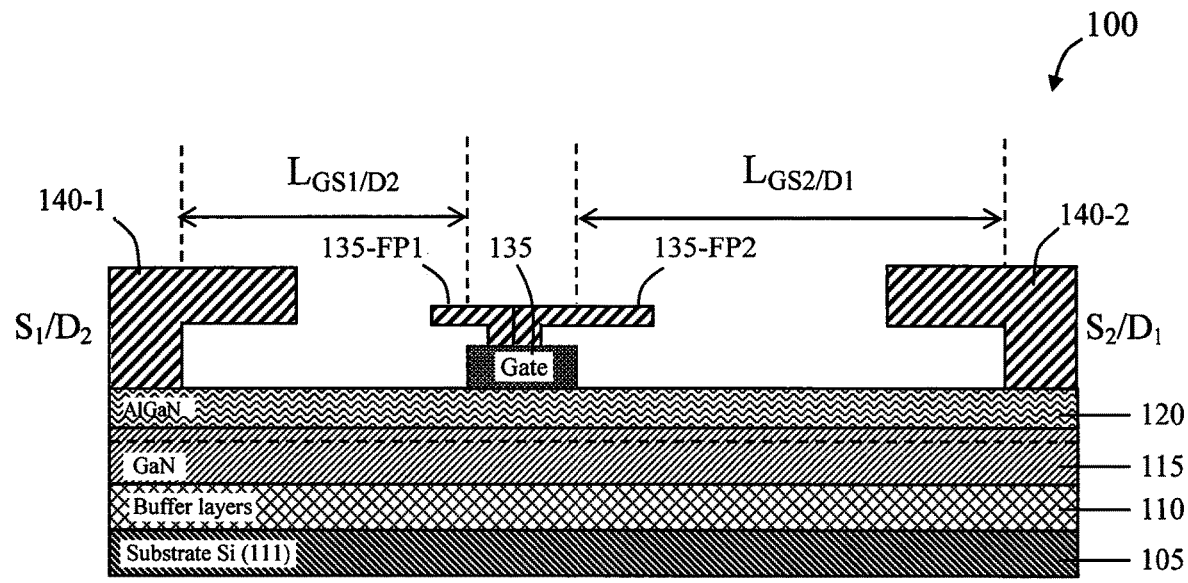
FIGS. 2 to 5 are cross sectional views of the asymmetrical blocking switching devices as different preferred embodiment of this invention.

Referring to FIG. 2 for a cross sectional view of a bidirectional GaN switch formed as a high electron mobility transistor (HEMT) semiconductor power device 100 of this invention. The bidirectional GaN switching device 100 comprises an AlGaN layer 120 epitaxial grown on top of gallium nitride (GaN) layer 115 thus forming an AlGaN/GaN hetero-junction located at the interface. The AlGaN/GaN hetero-junction structure is supported on buffer layer 110 supported on a substrate 105. A first electrode 140-1 and a second electrode 140-2 are disposed on two opposite sides of a gate electrode 135 to control the bidirectional current flow through the hetero-junction between the interface of the AlGaN and GaN layers. The gate electrode 135 is insulated from the AlGaN layer 120. In order to configure the bidirectional GaN switch as an asymmetrical block switch, the distance between the first electrode 140-1 and the gate 135, i.e., $L_{CS1/D2}$ is formed to be different from the distance between the second electrode 140-2 and the gate 135, i.e., $L_{GS2/D1}$. Therefore, in this bi-directional GaN HEMT single gate device as shown in FIG. 2, it is designed to have asymmetric blocking because the distance from the gate to respective source/drain regions are different, i.e., LGD1≠LGD2. Furthermore, the field plates 135-FP1 and 135-FP2 on the gate 135 are also formed to be asymmetric to achieve asymmetric blocking.

Figure 2A:
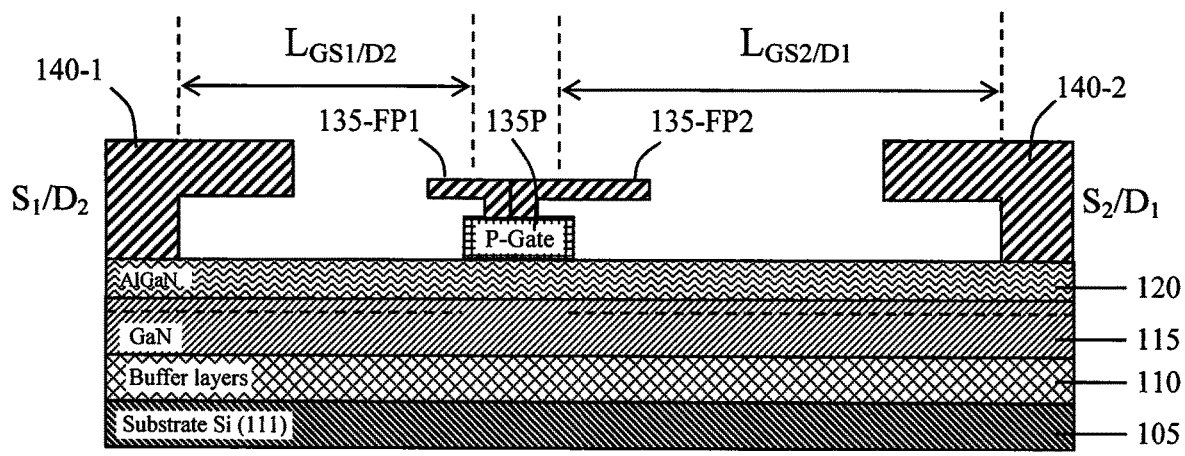

FIG. 2A is another embodiment of an asymmetrical bidirectional GaN switch of this invention similar to the device as that shown in FIG. 2. The only difference is the gate 135P of this embodiment is formed as a p-type AlGaN gate.

Figure 3:
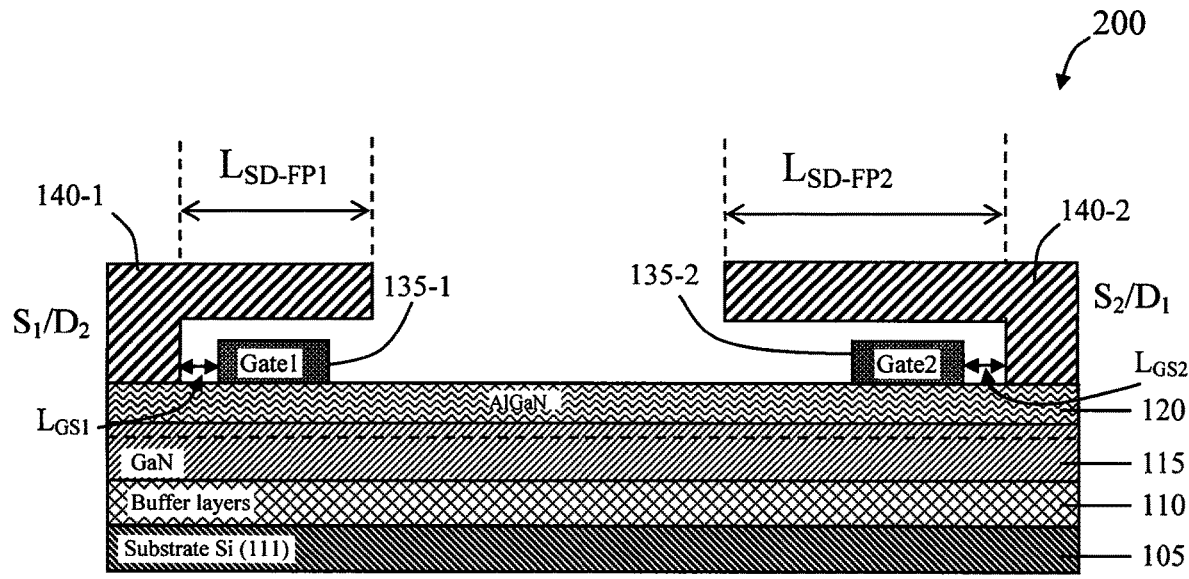

Referring to FIG. 3 for a cross sectional view of a bidirectional asymmetrical blocking switch formed as a GaN high electron mobility transistor (HEMT) semiconductor power device 200 of this invention. The bidirectional GaN switch device 200 comprises an AlGaN layer 120 epitaxial grown on top of gallium nitride (GaN) layer 115 thus forming an AlGaN/GaN hetero-junction located at the interface. The AlGaN/GaN hetero-junction structure is supported on buffer layer 110 supported on a substrate 105. A first electrode 140-1 and a second electrode 140-2 are disposed on two opposite sides of a top surface of the AlGaN layer 120. The asymmetrical blocking switch further comprises dual gates 135-1 and 135-2 disposed under the field plates 140-1-FP and 140-2-FP respectively.

In order to configure the bidirectional blocking switch as an asymmetrical block switch, the field plates of the first and the second drain/source electrodes, i.e., first field plate $L_{SD-FP1}$ is formed to have different length from second field plate $L_{SD-FP2}$, The distances between the gate and the electrodes, i.e., $L_{GS1}$ and $L_{GS2}$ may also be formed to have an asymmetric configuration as well.

Figure 4:
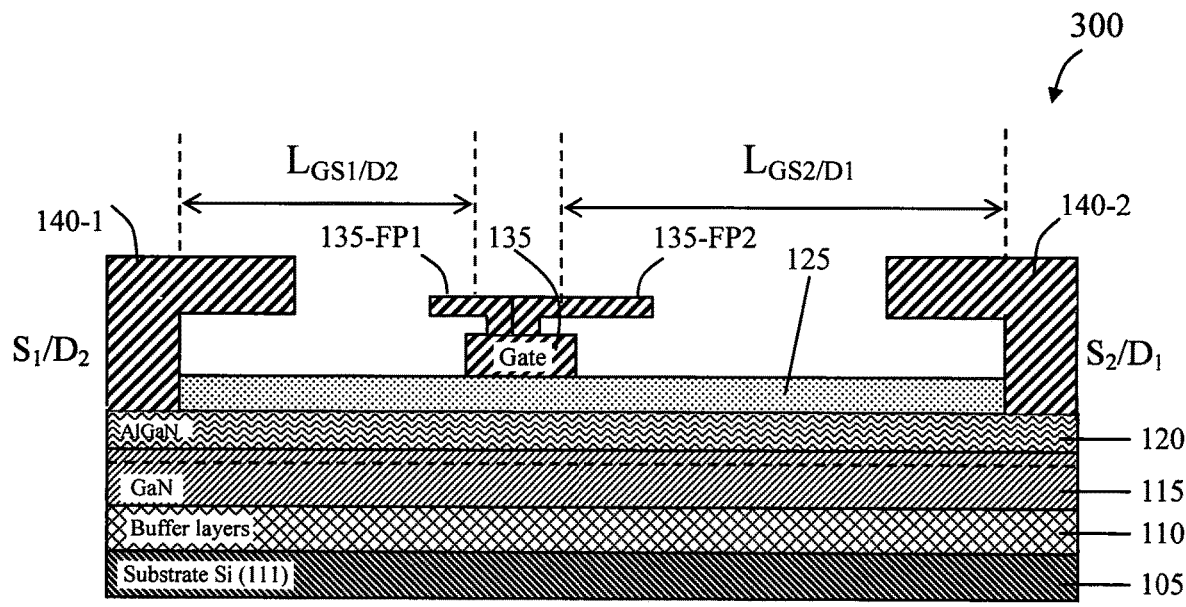

Referring to FIG. 4 for a cross sectional view of a bidirectional asymmetrical blocking switch formed as a single gate metal insulator semiconductor field effect transistor (MISFET) semiconductor power device 300 of this invention. The bidirectional GaN switch device 300 comprises an AlGaN layer 120 epitaxial grown on top of gallium nitride (GaN) layer 115 thus forming an AlGaN/GaN hetero-junction located at the interface. The AlGaN/GaN hetero-junction structure is supported on buffer layer 110 supported on a substrate 105. The bidirectional asymmetrical blocking switch 300 further includes a cap/passivation layer 125 that is formed as a layer of high resistance such as a layer of GaN/SiN/SiO2 and is a thin layer ranging between 2 to 200 nanometers. The cap/passivation layer 125 may be formed as a passivation or a gate dielectric layer composed of SiN or SiO2.

A first electrode 140-1 and a second electrode 140-2 are disposed on two opposite sides of a gate electrode 135 to control the bidirectional current flow through the hetero-junction between the interface of the AlGaN and GaN layers.

In order to configure the bidirectional GaN switch as an asymmetrical block switch, the distance between the first electrode 140-1 and the gate 135, i.e., $L_{GS1/D2}$ is formed to be different from the distance between the second electrode 140-2 and the gate 135, i.e., $L_{GS2/D1}$. Therefore, in this bi-directional GaN HEMT single gate device as shown in FIG. 4, it is designed to have asymmetric blocking because the distance from the gate to respective source/drain regions are different, i.e., $L_{GD1}$≠$L_{GD2}$. Furthermore, the field plates 135-FP1 and 135-FP2 on the gate 135 are also formed to be asymmetric to achieve asymmetric blocking.

Figure 5:
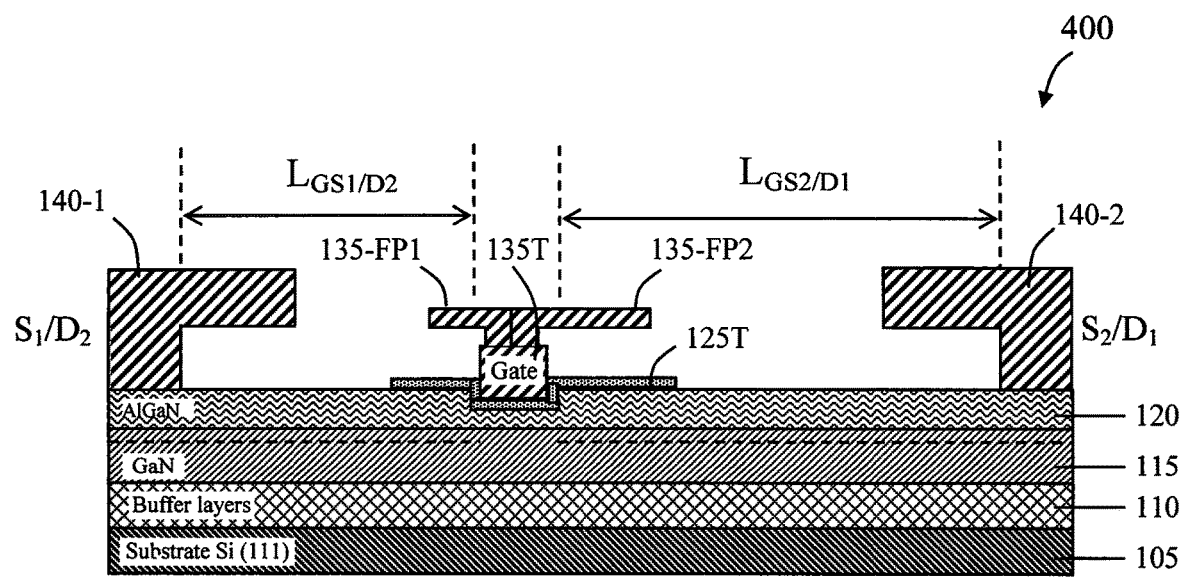

Referring to FIG. 5 for a cross sectional view of an alternate embodiment of this invention. The bidirectional switch is formed as a bidirectional GaN high electron mobility transistor (HEMT) semiconductor power device 400. The bidirectional GaN switch device 400 comprises an AlGaN layer 120 epitaxial grown on top of gallium nitride (GaN) layer 115 thus forming an AlGaN/GaN hetero-junction located at the interface. The AlGaN/GaN hetero-junction structure is supported on buffer layer 110 supported on a substrate 105. A first electrode 140-1 and a second electrode 140-2 are disposed on two opposite sides of a gate electrode 135 to control the bidirectional current flow through the hetero-junction between the interface of the AlGaN and GaN layers. The gate electrode 135T is formed as a trenched gate that is insulated from the AlGaN layer 120 by an insulation layer 125T. In order to configure the bidirectional GaN switch as an asymmetrical block switch, the distance between the first electrode 140-1 and the gate 135T, i.e., $L_{GS1/D2}$ is formed to be different from the distance between the second electrode 140-2 and the gate 135T, i.e., $L_{GS2/D1}$. Therefore, in this bi-directional enhance mode GaN HEMT single gate device as shown in FIG. 5, it is designed to have asymmetric blocking because the distance from the gate to respective source/drain regions are different, i.e., $L_{GD1}$≠$L_{GD2}$. Furthermore, the field plates 135-FP1 and 135-FP2 on the gate 135 are also formed to be asymmetric to achieve asymmetric blocking.

Figure 6A:
FIGS. 6A to 6G are a series of cross sectional views to illustrate the processing steps of manufacturing the devices of this invention.
Figure 6B:
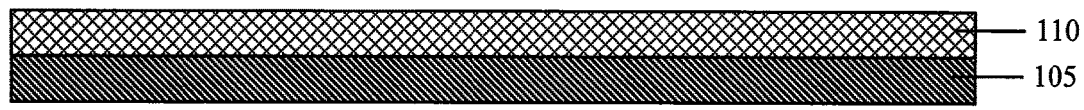
Figure 6C:
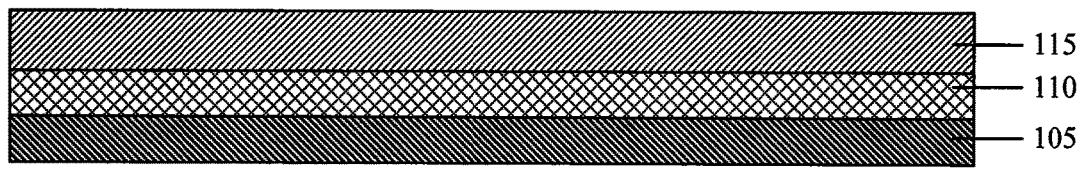
Figure 6D:
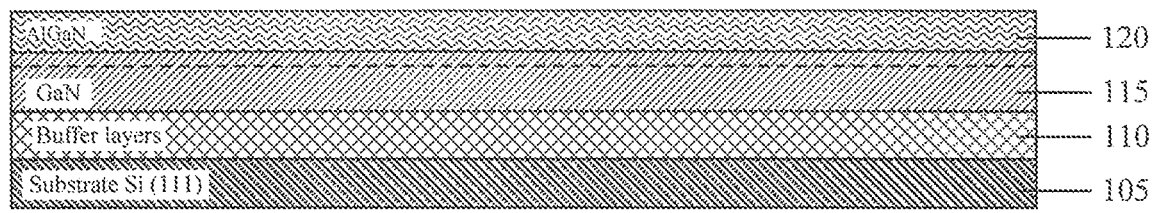
Figure 6E:
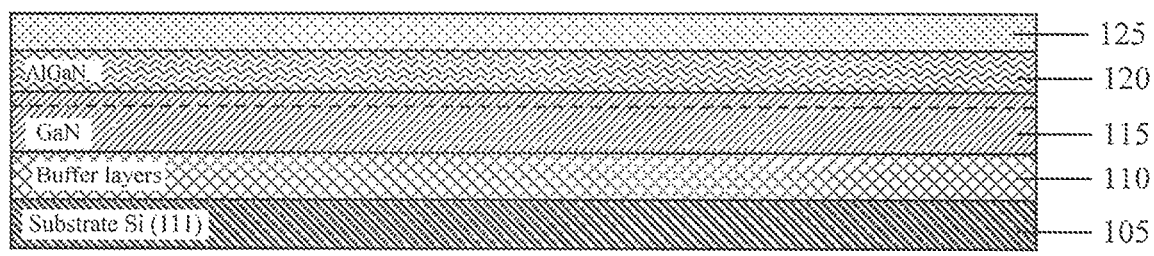
Figure 6F:
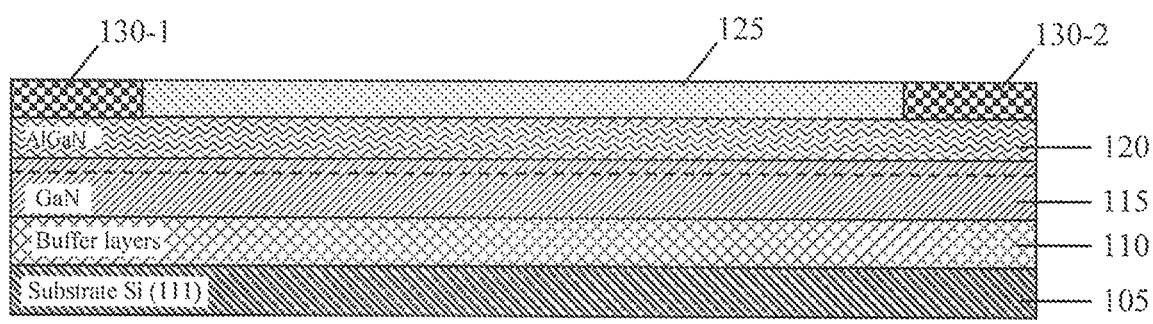
Figure 6G:
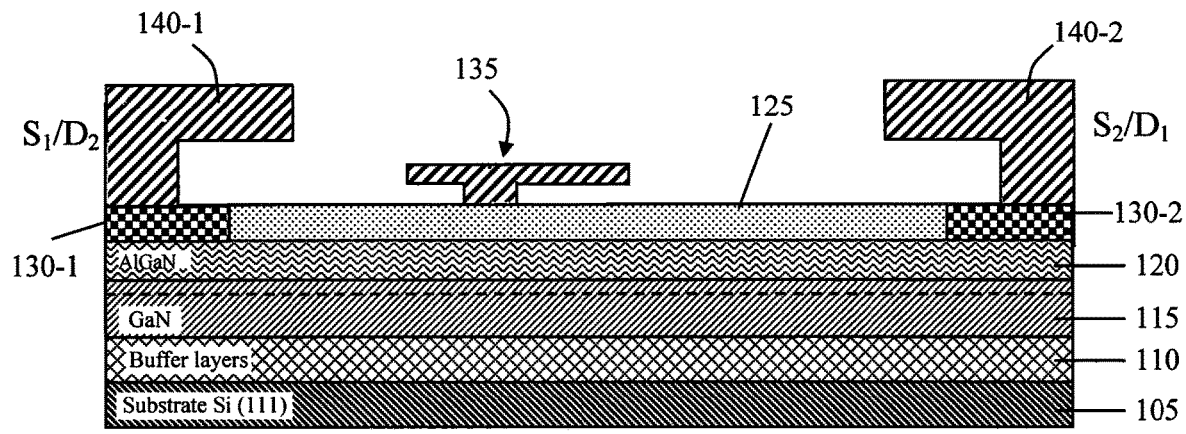

FIGS. 6A to 6G are a series of cross sectional views to illustrate the processing steps for manufacturing a bi-directional asymmetrical central MIS gate blocking GaN switch of this invention. In FIG. 6A, the process flow starts with a substrate 105. The substrate 105 may be silicon (Si), silicon carbide (SiC), Gallium nitride (GaN), or a sapphire substrate. In FIG. 6B, an epitaxial layer 110 as a buffer layer is grown. The buffer layer may be grown by different methods and may be the combinations of layers including GaN, AlN, AlGaN, etc. The buffer layer 110 grown as epitaxial layer may have a thickness ranging between 0.25 □m to 7 □m depending on the voltage for specific applications. The buffer layer 110 may be doped with Fe, C or it may also be unintentionally doped. In FIG. 6C, a channel layer composed of GaN epitaxial layer 115 is grown. The channel layer has a layer thickness ranging from 100 to 400 nanometers (nm). In FIG. 6D, a barrier epitaxial 120 is grown. The barrier epitaxial layer 120 may be formed with $Al_xGa_{1-x}N$ (for example, 0.18<x<28) that has a thickness ranging between 10 to 30 nm, or may be formed with AlN with a thickness ranging between 2 to 10 nm. The barrier epitaxial layer 120 is composed of a material that has a bandgap larger than GaN. In FIG. 6E, a cap/passivation layer 125 is deposited. The cap or passivation layer may be a layer of high resistance such as a layer of GaN/SiN/SiO2 and is formed as a thin layer ranging between 2 to 200 nanometers. The cap/passivation layer 125 may be formed as a layer of insulator to function as a passivation or a gate dielectric layer composed of SiN or SiO2. In FIG. 6F, the source/drain ohmic contacts are formed by applying a standard process to form the metal contacts 130-1 and 130-2 composed of metals of Ti, Al, Ni, or Au. In FIG. 6G, processes are carried out to form the gate/field plate 135 and the source/drain field plates 140-1 and 140-2. The configuration of the gate 135 and the source/drain field plates 140-1 and 140-2 depends on the device voltage and the epitaxial design of the asymmetrical blocking switches as discussed above.

Figure 7A:
FIGS. 7A to 7H are a series of cross sectional views to illustrate the processing steps of manufacturing the devices of this invention.
Figure 7B:
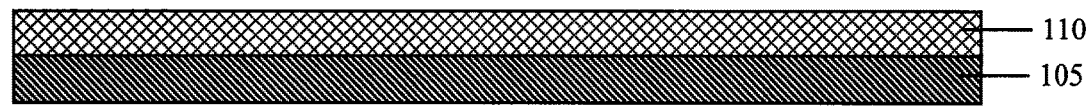
Figure 7C:
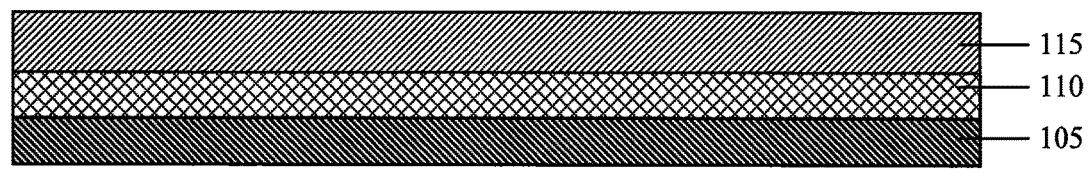
Figure 7D:
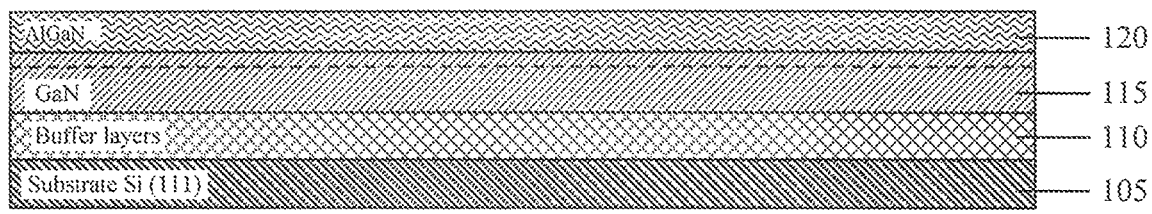
Figure 7E:
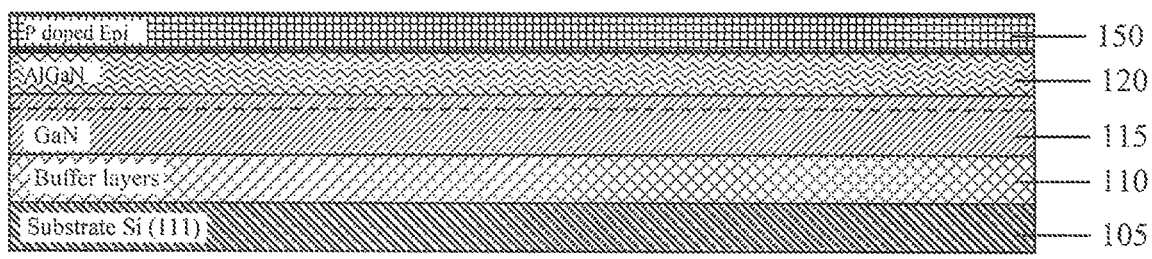
Figure 7F:
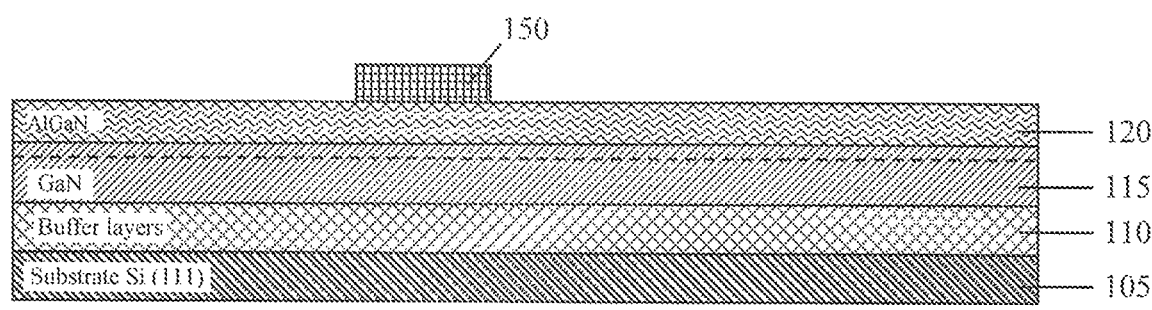
Figure 7G:
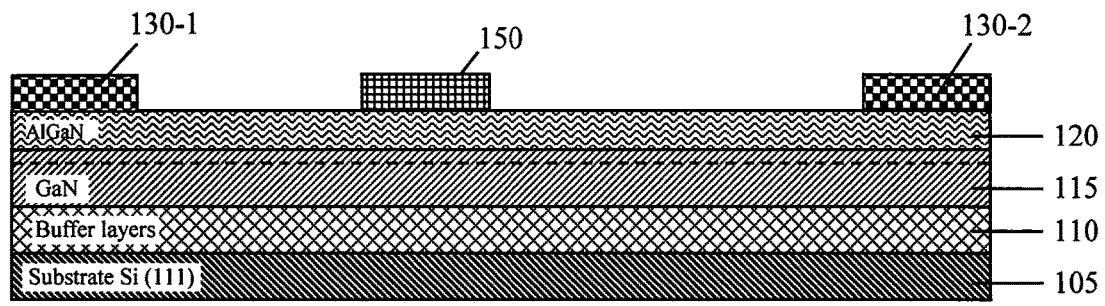
Figure 7H:
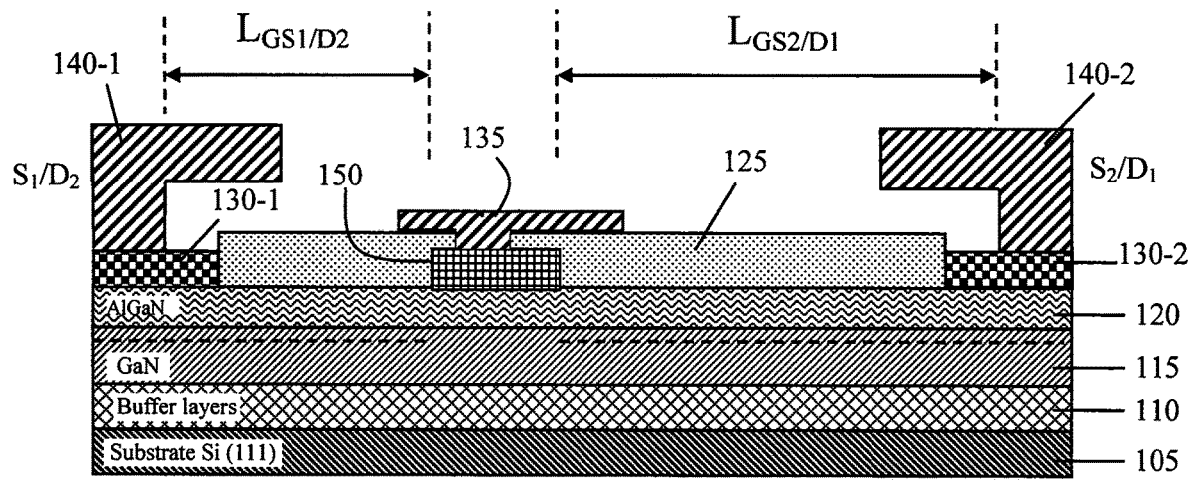

FIGS. 7A to 7H are a series of cross sectional views to illustrate the processing steps for manufacturing a bi-directional asymmetrical central P-type gate blocking GaN switch with an asymmetric central gate of this invention. In FIG. 7A, the process flow starts with a substrate 105. The substrate 105 may be silicon (Si), silicon carbide (SiC), Gallium nitride (GaN), or a sapphire substrate. In FIG. 7B, an epitaxial layer 110 as a buffer layer is grown. The buffer layer may be grown by different methods and may be the combinations of layers including GaN, AlN, AlGaN, etc. The buffer layer 110 grown as epitaxial layer may have a thickness ranging between 0.25 □m to 7 □m depending on the voltage for specific applications. The buffer layer 110 may be doped with Fe, C or it may also be unintentionally doped. In FIG. 7C, a channel layer composed of GaN epitaxial layer 115 is grown. The channel layer has a layer thickness ranging from 100 to 400 nanometers (nm). In FIG. 7D, a barrier epitaxial 120 is grown. The barrier epitaxial layer 120 may be formed with $Al_xGa_{1-x}N$ (for example, 0.18<x<28) that has a thickness ranging between 10 to 30 nm, or may be formed with MN with a thickness ranging between 2 to 10 nm. The barrier epitaxial layer 120 is composed of a material that has a bandgap larger than GaN. In FIG. 7E, a P-type epitaxial layer 150 is deposited. The P-type epitaxial layer may be a similar material such as a GaN or AlGaN and doped with P-type dopant such as Mg and is formed as a thin layer ranging between 2 to 200 nanometers. In FIG. 7F, an etch process is carried out to pattern the P-epitaxial layer 150 for defining a gate area. In FIG. 7G, the source/drain ohmic contacts are formed by applying a standard process to form the metal contacts 130-1 and 130-2 composed of metals of Ti, Al, Ni, or Au. In FIG. 7H, a cap/passivation layer 125 is deposited. The cap or passivation layer may be a layer of high resistance such as a layer of GaN/SiN/SiO2 and is formed as a thin layer ranging between 2 to 200 nanometers. The cap/passivation layer 125 may be formed as a layer of insulator to function as a passivation or a gate dielectric layer composed of SiN or SiO2. Then processes are carried out to form the gate/field plate 135 and the source/drain field plates 140-1 and 140-2. The configuration of the gate 135 and the source/drain field plates 140-1 and 140-2 depends on the device voltage and the epitaxial design of the asymmetrical blocking switches as discussed above.

Figure 8A:
FIGS. 8A to 8I are a series of cross sectional views to illustrate the processing steps of manufacturing the devices of this invention.
Figure 8B:
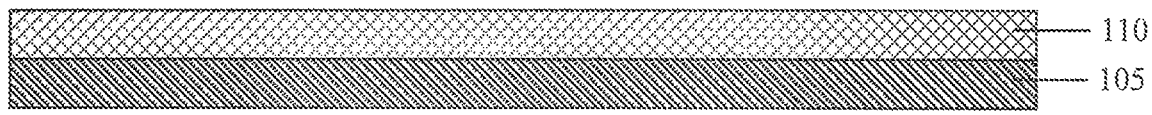
Figure 8C:
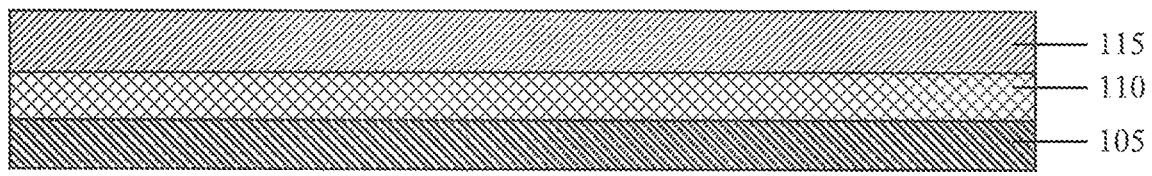
Figure 8D:
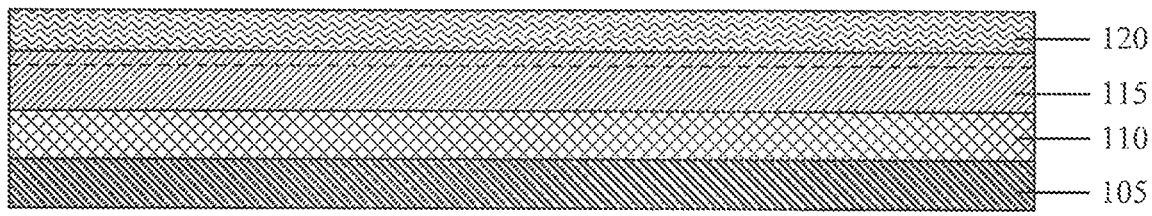
Figure 8E:
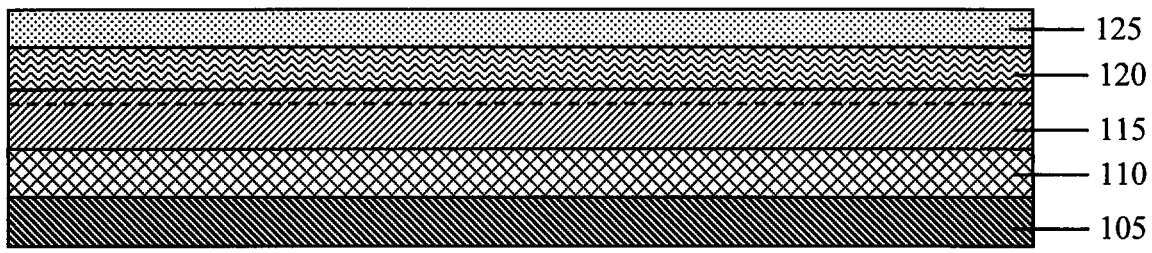
Figure 8F:
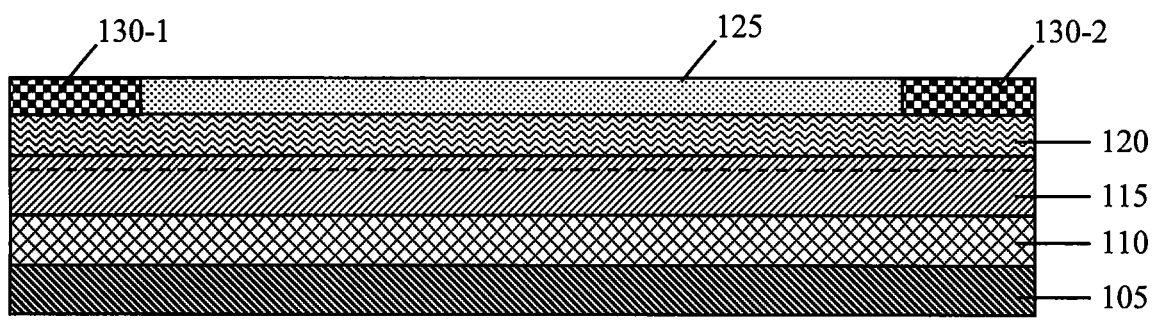
Figure 8G:
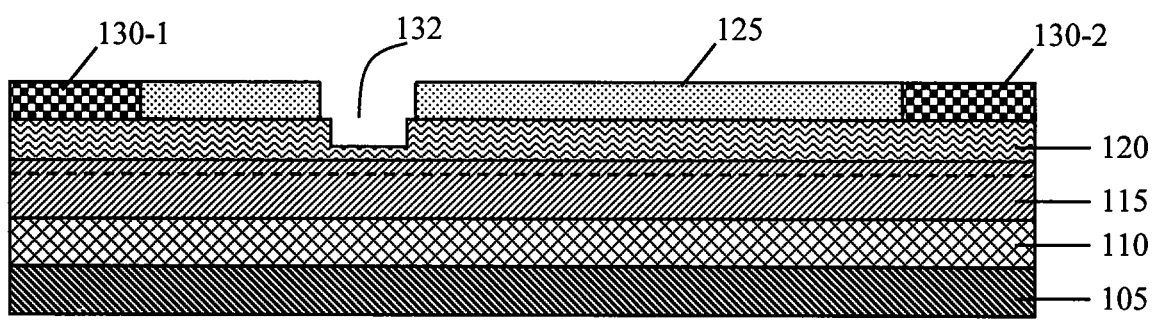
Figure 8H:
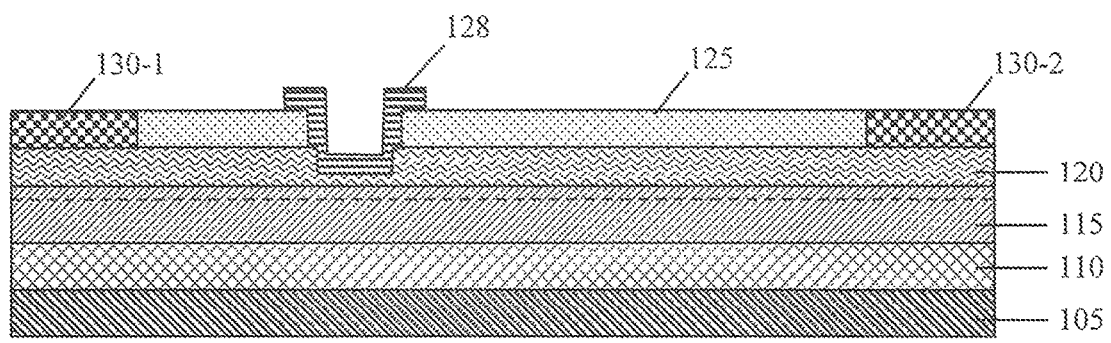
Figure 8I:
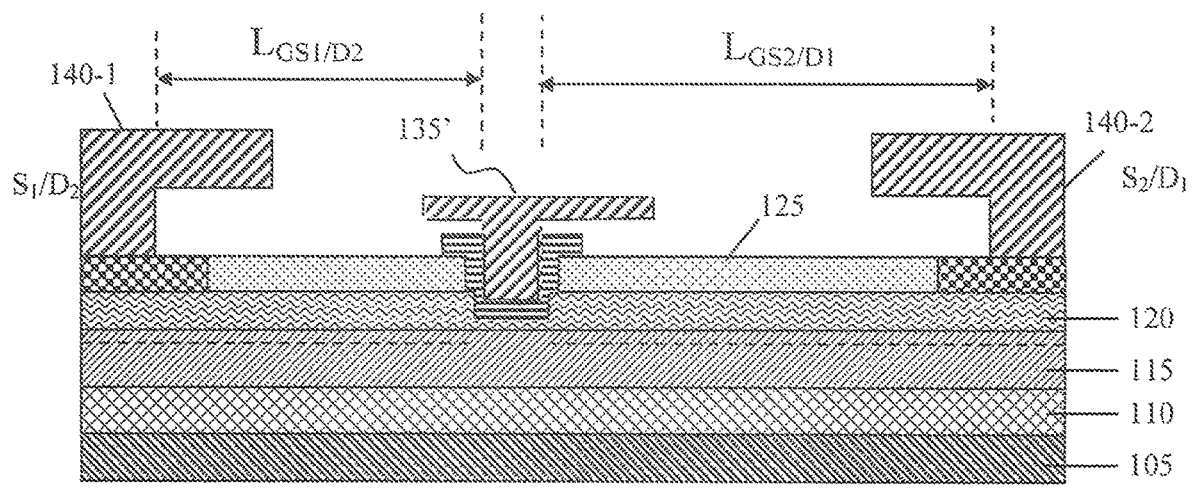

FIGS. 8A to 8I are a series of cross sectional views to illustrate the processing steps for manufacturing a bi-directional asymmetrical central trench MIS-gate blocking GaN switch of this invention. In FIG. 8A, the process flow starts with a substrate 105. The substrate 105 may be silicon (Si), silicon carbide (SiC), Gallium nitride (GaN), or a sapphire substrate. In FIG. 8B, an epitaxial layer 110 as a buffer layer is grown. The buffer layer may be grown by different methods and may be the combinations of layers including GaN, AlN, AlGaN, etc. The buffer layer 110 grown as epitaxial layer may have a thickness ranging between 0.25 □m to 7 □m depending on the voltage for specific applications. The buffer layer 110 may be doped with Fe, C or it may also be unintentionally doped. In FIG. 8C, a channel layer composed of GaN epitaxial layer 115 is grown. The channel layer has a layer thickness ranging from 100 to 400 nanometers (nm). In FIG. 8D, a barrier epitaxial 120 is grown. The barrier epitaxial layer 120 may be formed with $Al_xGa_{1-x}N$ (for example, 0.18<x<28) that has a thickness ranging between 10 to 30 nm, or may be formed with AlN with a thickness ranging between 2 to 10 nm. The barrier epitaxial layer 120 is composed of a material that has a bandgap larger than GaN. In FIG. 8E, a cap/passivation layer 125 is deposited. The cap/passivation layer may be a layer of high resistance such as a layer of GaN/SiN/SiO2 and is formed as a thin layer ranging between 2 to 200 nanometers. The cap/passivation layer 125 may be formed as a layer of insulator to function as a passivation or a gate dielectric layer composed of SiN or SiO2. In FIG. 8F, the source/drain ohmic contacts are formed by applying a standard process to form the metal contacts 130-1 and 130-2 composed of metals of Ti, Al, Ni, or Au. In FIG. 8G, an etch process is performed to etch through the passivation layer 125 and the barrier layer 120 to open a gate trench 132 into the barrier layer 120 to reduce the electrons in the two-dimension electron gas (2DEG). In FIG. 8H, a gate dielectric layer 128 is deposited. The gate dielectric layer may compose of Si3N4, SiO2, or other material with high resistivity. In FIG. 8I, processes are carried out to form the trench gate/field plate 135' and the source/drain field plates 140-1 and 140-2. The configuration of the gate 135' and the source/drain field plates 140-1 and 140-2 depends on the device voltage and the epitaxial design of the asymmetrical blocking switches as discussed above.

Figure 9A:
FIGS. 9A to 9G are a series of cross sectional views to illustrate the processing steps of manufacturing the devices of this invention.
Figure 9B:
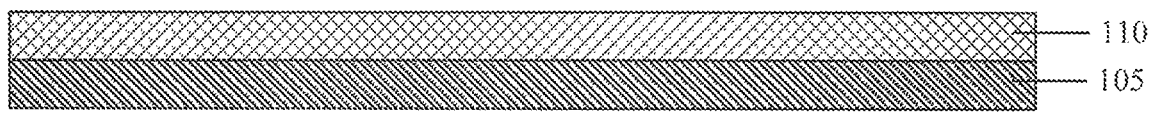
Figure 9C:
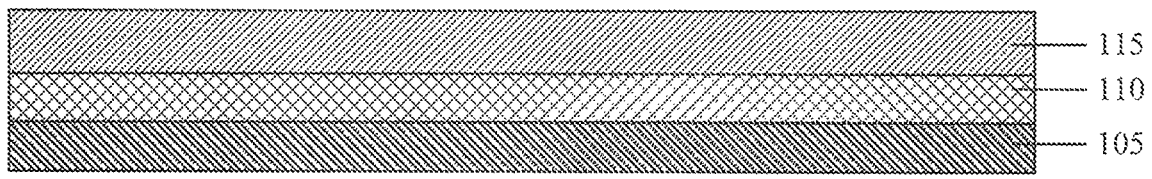
Figure 9D:
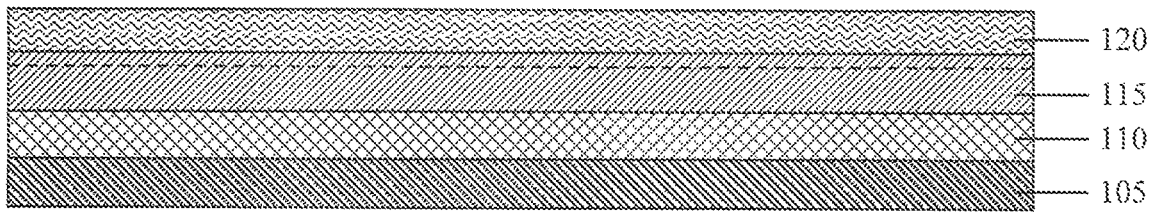
Figure 9E:
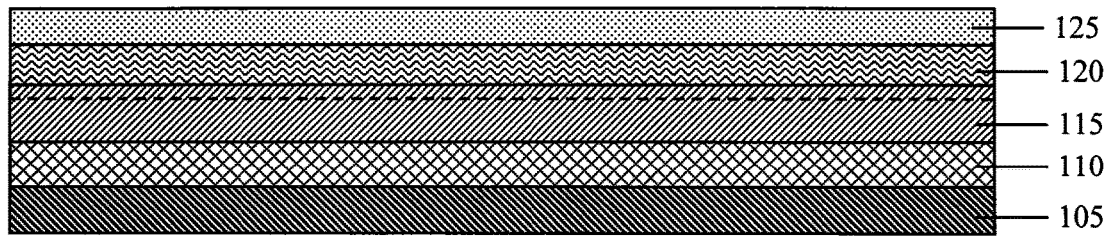
Figure 9F:
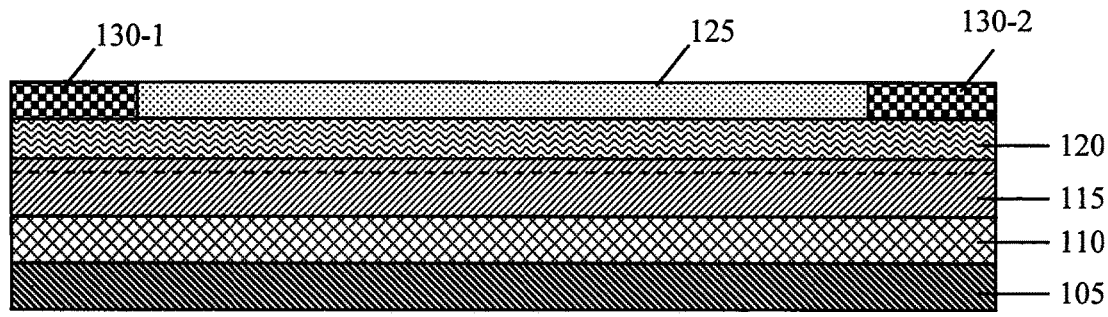
Figure 9G:
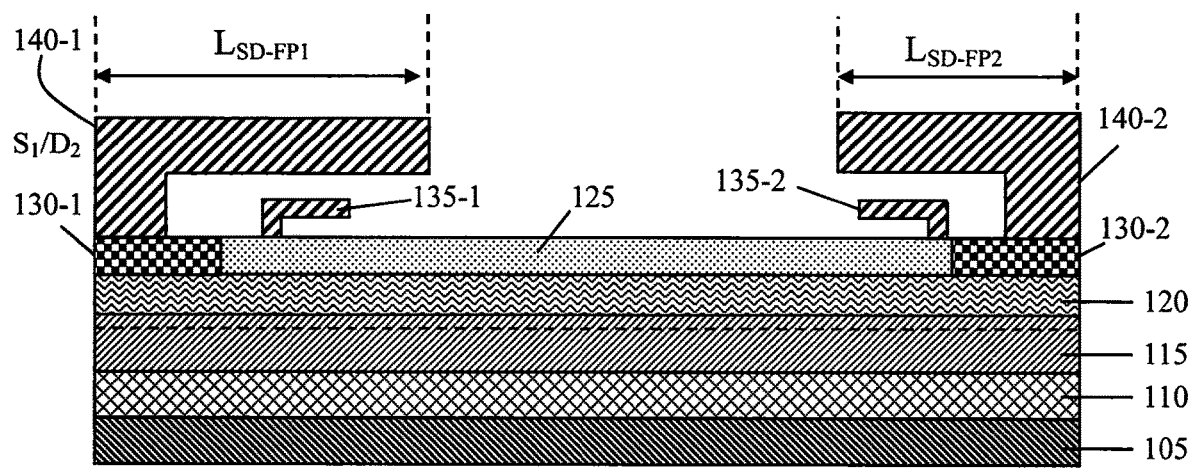

FIGS. 9A to 9G are a series of cross sectional view to illustrate the processing steps for manufacturing a bi-directional asymmetrical dual MIS-gate blocking GaN switch of this invention. In FIG. 9A, the process flow starts with a substrate 105. The substrate 105 may be silicon (Si), silicon carbide (SiC), Gallium nitride (GaN), or a sapphire substrate. In FIG. 9B, an epitaxial layer 110 as a buffer layer is grown. The buffer layer may be grown by different methods and may be the combinations of layers including GaN, AlN, AlGaN, etc. The buffer layer 110 grown as epitaxial layer may have a thickness ranging between 0.25 □m to 7 □m depending on the voltage for specific applications. The buffer layer 110 may be doped with Fe, C or it may also be unintentionally doped. In FIG. 9C, a channel layer composed of GaN epitaxial layer 115 is grown. The channel layer has a layer thickness ranging from 100 to 400 nanometers (nm). In FIG. 9D, a barrier epitaxial 120 is grown. The barrier epitaxial layer 120 may be formed with $Al_xGa_{1-x}N$ (for example, 0.18<x<28) that has a thickness ranging between 10 to 30 nm, or may be formed with AlN with a thickness ranging between 2 to 10 nm. The barrier epitaxial layer 120 is composed of a material that has a bandgap larger than GaN. In FIG. 9E, a cap/passivation layer 125 is deposited. The cap or passivation layer may be a layer of high resistance such as a layer of GaN/SiN/SiO2 and is formed as a thin layer ranging between 2 to 200 nanometers. The cap/passivation layer 125 may be formed as a layer of insulator to function as a passivation or a gate dielectric layer composed of SiN or SiO2. In FIG. 9F, the source/drain ohmic contacts are formed by applying a standard process to form the metal contacts 130-1 and 130-2 composed of metals of Ti, Al, Ni, or Au. In FIG. 9G, processes are carried out to form the dual gates/field plates 135-1, 135-2 and the source/drain field plates 140-1 and 140-2. The configuration of the dual gates 135-1 and 135-2 and also the lengths of the source/drain field plates 140-1 and 140-2 depend on the device voltage and the epitaxial design of the asymmetrical blocking switches as discussed above.

Figure 10A:
FIGS. 10A to 10H are a series of cross sectional views to illustrate the processing steps of manufacturing the devices of this invention.
Figure 10B:
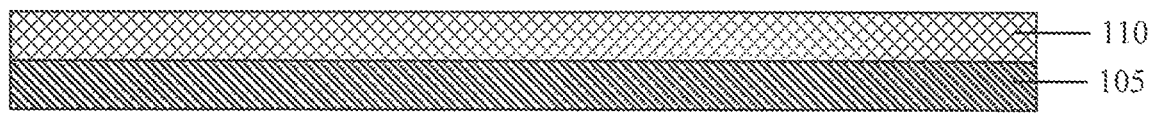
Figure 10C:
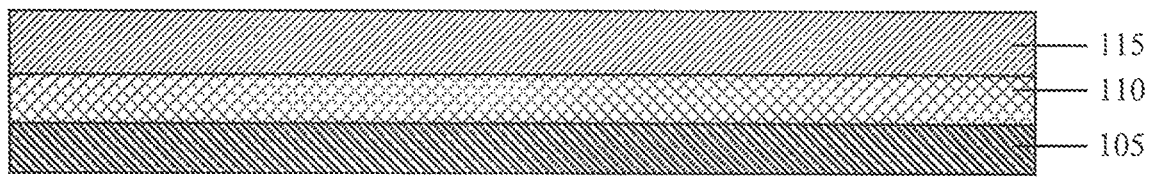
Figure 10D:
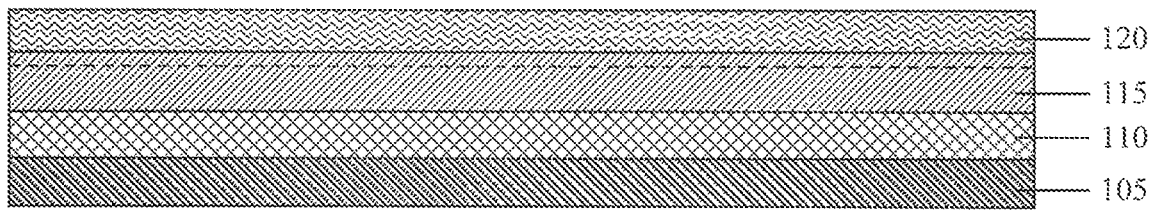
Figure 10E:
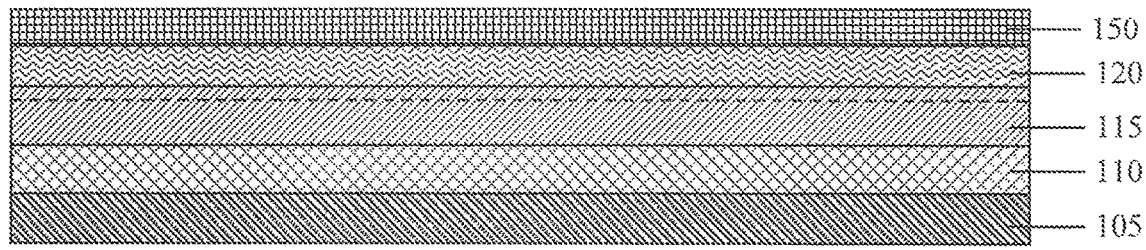
Figure 10F:
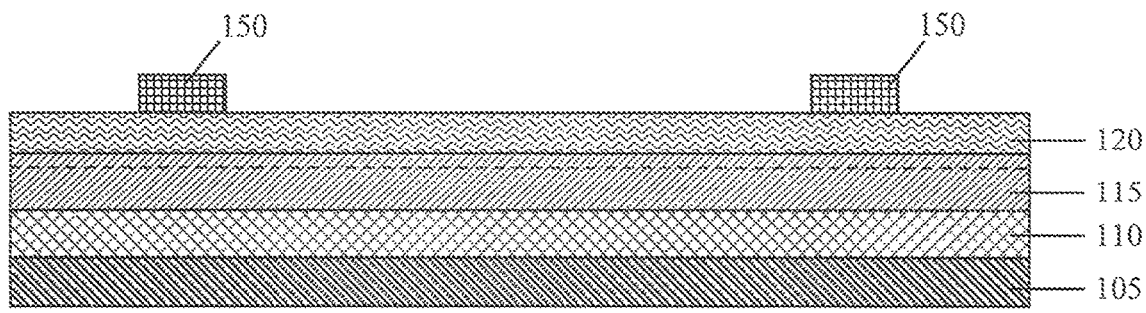
Figure 10G:
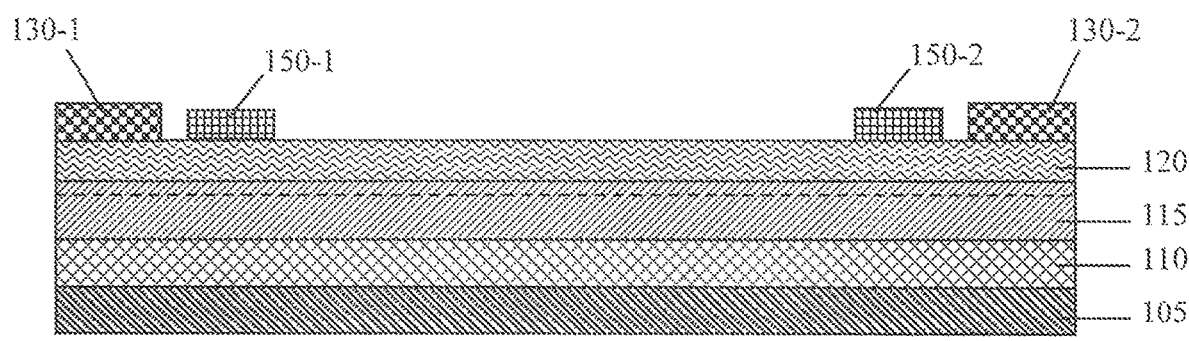
Figure 10H:
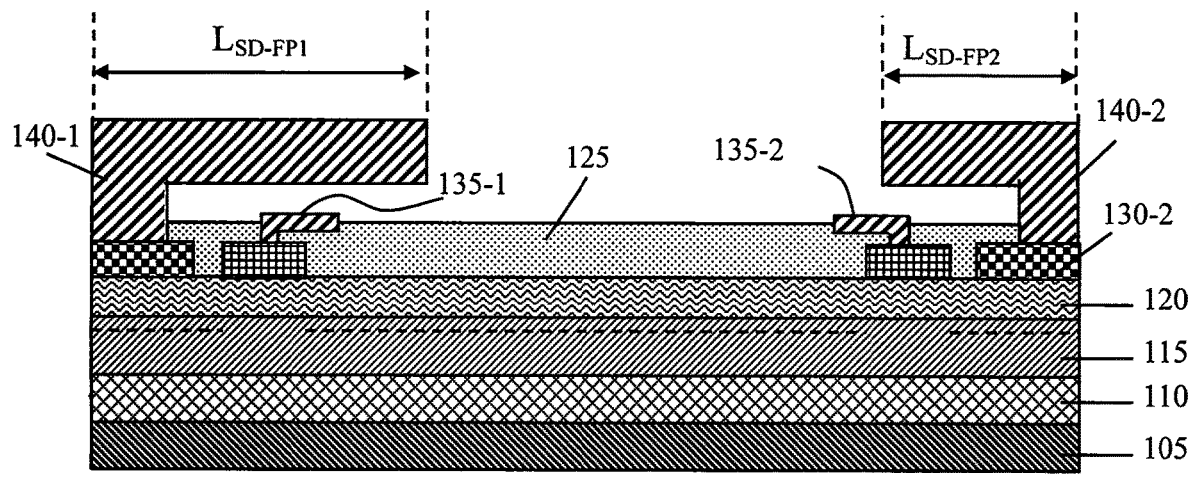

FIGS. 10A to 10H are a series of cross sectional views to illustrate the processing steps for manufacturing a bi-directional asymmetrical dual P-type gate blocking GaN switch with an asymmetric central gate of this invention. In FIG. 10A, the process flow starts with a substrate 105. The substrate 105 may be silicon (Si), silicon carbide (SiC), Gallium nitride (GaN), or a sapphire substrate. In FIG. 10B, an epitaxial layer 110 as a buffer layer is grown. The buffer layer may be grown by different methods and may be the combinations of layers including GaN, AlN, AlGaN, etc. The buffer layer 110 grown as epitaxial layer may have a thickness ranging between 0.25 ☐m to 7 ☐m depending on the voltage for specific applications. The buffer layer 110 may be doped with Fe, C or it may also be unintentionally doped. In FIG. 10C, a channel layer composed of GaN epitaxial layer 115 is grown. The channel layer has a layer thickness ranging from 100 to 400 nanometers (nm). In FIG. 10D, a barrier epitaxial 120 is grown. The barrier epitaxial layer 120 may be formed with $Al_xGa_{1-x}N$ (for example, 0.18<x<28) that has a thickness ranging between 10 to 30 nm, or may be formed with AlN with a thickness ranging between 2 to 10 nm. The barrier epitaxial layer 120 is composed of a material that has a bandgap larger than GaN. In FIG. 10E, a P-type epitaxial layer 150 is deposited. The P-type epitaxial layer may be a layer doped with AlGaN and is formed as a thin layer ranging between 2 to 200 nanometers. In FIG. 10F, an etch process is carried out to pattern the P-epitaxial layer 150 for defining the areas 150-1 and 150-2 for dual gates. In FIG. 10G, the source/drain ohmic contacts are formed by applying a standard process to form the metal contacts 130-1 and 130-2 composed of metals of Ti, Al, Ni, or Au. In FIG. 10H, a cap/passivation layer 125 is deposited. The cap or passivation layer may be a layer of high resistance such as a layer of GaN/SiN/SiO2 and is formed as a thin layer ranging between 2 to 200 nanometers. The cap/passivation layer 125 may be formed as a layer of insulator to function as a passivation or a gate dielectric layer composed of SiN or SiO2. Then processes are carried out to form the dual gates/field plates 135-1 and 135-2 and the source/drain field plates 140-1 and 140-2. The configuration of the dual gates 135-1, 135-2 and the source/drain field plates 140-1 and 140-2 depends on the device voltage and the epitaxial design of the asymmetrical blocking switches as discussed above.

Figure 11A:
FIGS. 11A to 11I are a series of cross sectional views to illustrate the processing steps of manufacturing the devices of this invention.
Figure 11B:
Figure 11C:
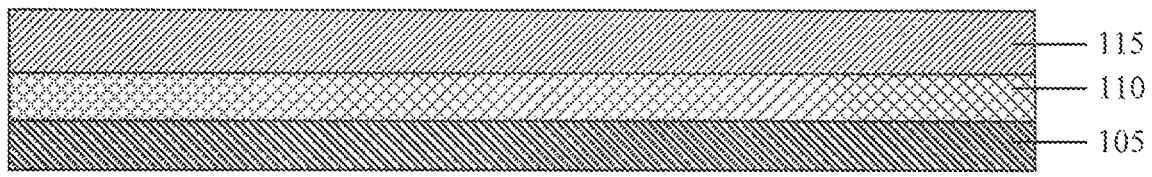
Figure 11D:
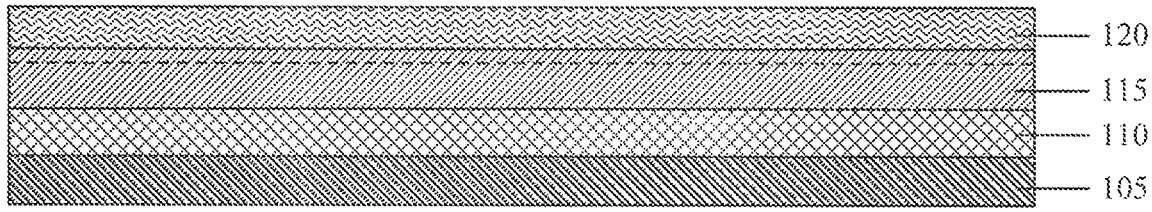
Figure 11E:
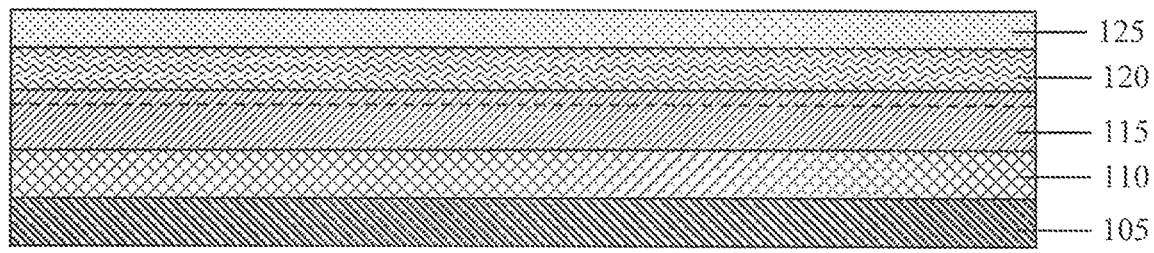
Figure 11F:
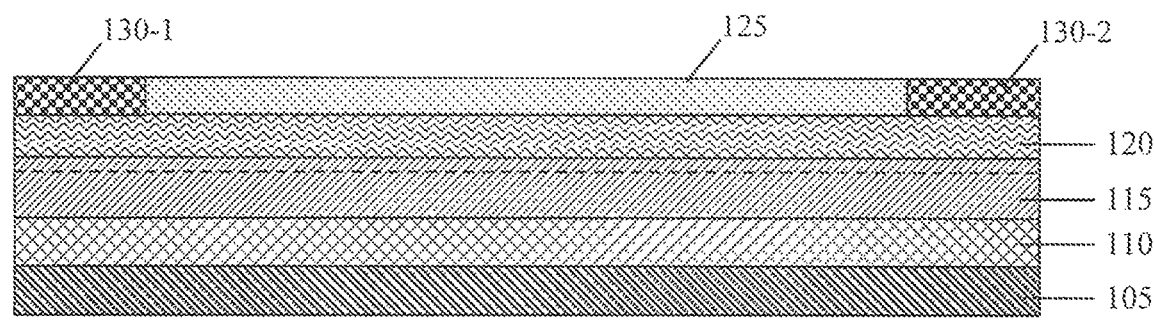
Figure 11G:
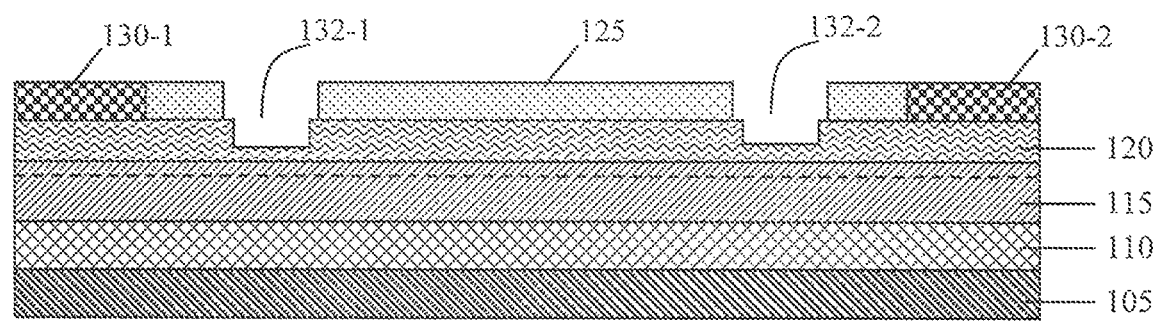
Figure 11H:
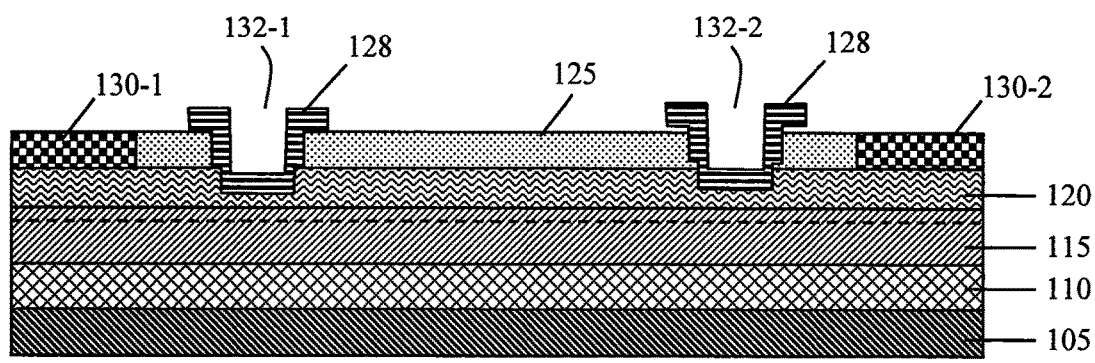
Figure 11I:
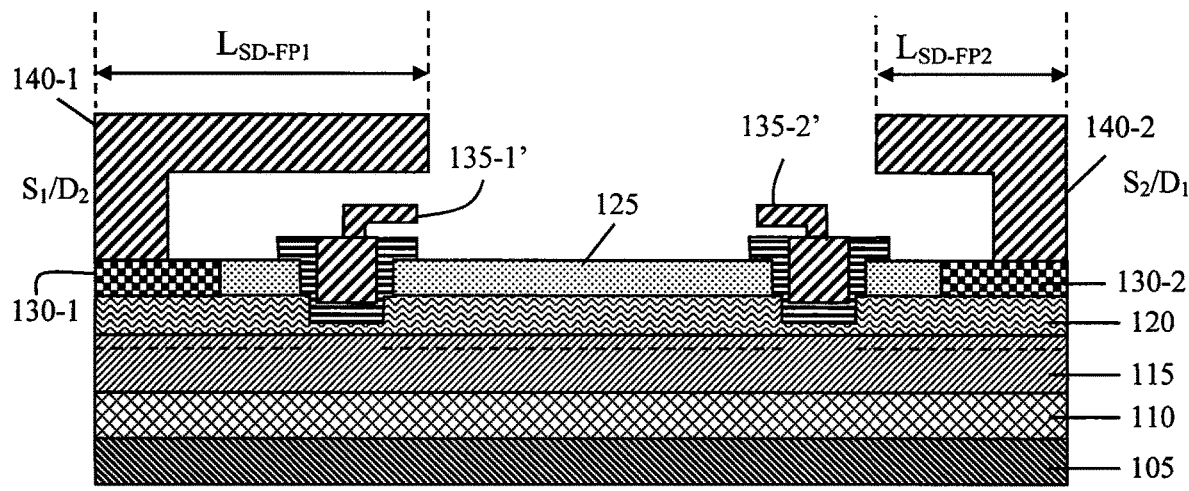

FIGS. 11A to 11I are a series of cross sectional views to illustrate the processing steps for manufacturing a bi-directional asymmetrical dual trench MIS-gate blocking GaN switch of this invention. In FIG. 11A, the process flow starts with a substrate 105. The substrate 105 may be silicon (Si), silicon carbide (SiC), Gallium nitride (GaN), or a sapphire substrate. In FIG. 11B, an epitaxial layer 110 as a buffer layer is grown. The buffer layer may be grown by different methods and may be the combinations of layers including GaN, AlN, AlGaN, etc. The buffer layer 110 grown as epitaxial layer may have a thickness ranging between 0.25 ☐m to 7 ☐m depending on the voltage for specific applications. The buffer layer 110 may be doped with Fe, C or it may also be unintentionally doped. In FIG. 11C, a channel layer composed of GaN epitaxial layer 115 is grown. The channel layer has a layer thickness ranging from 100 to 400 nanometers (nm). In FIG. 8D, a barrier epitaxial 120 is grown. The barrier epitaxial layer 120 may be formed with $Al_xGa_{1-x}N$ (for example, 0.18<x<28) that has a thickness ranging between 10 to 30 nm, or may be formed with AlN with a thickness ranging between 2 to 10 nm. The barrier epitaxial layer 120 is composed of a material that has a bandgap larger than GaN. In FIG. 11E, a cap/passivation layer 125 is deposited. The cap or passivation layer may be a layer of high resistance such as a layer of GaN/SiN/SiO2 and is formed as a thin layer ranging between 2 to 200 nanometers. The cap/passivation layer 125 may be formed as a layer of insulator to function as a passivation or a gate dielectric layer composed of SiN or SiO2. In FIG. 11F, the source/drain ohmic contacts are formed by applying a standard process to form the metal contacts 130-1 and 130-2 composed of metals of Ti, Al, Ni, or Au. In FIG. 11G, an etch process is performed to etch through the passivation layer 125 and the barrier layer 120 to open dual gate trenches 132-1 and 132-2 into the barrier layer 120 to reduce the electrons in 2DEG. In FIG. 11H, a gate dielectric layer 128 is deposited into the dual gate trenches 132-1 and 132-2. The gate dielectric layer may compose of Si3N4, SiO2, or other material with high resistivity. In FIG. 11I, processes are carried out to form the dual trench gates/field plates 135-1' and 135-2' and the source/drain field plates 140-1 and 140-2. The configuration of the dual trench gates 135-1' and 135-2', and the source/drain field plates 140-1 and 140-2 depends on the device voltage and the epitaxial design of the asymmetrical blocking switches as discussed above.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A high electron mobility transistor (HEMT) gallium nitride (GaN) bidirectional blocking device comprising:
    a hetero junction structure comprises a first semiconductor layer interfacing a second semiconductor layer of two different band gaps thus generating an interface layer as a two-dimensional electron gas (2DEG) layer;
    a first source/drain electrode and a second source/drain electrode disposed on two opposite edges as two vertical blocks extending upwardly to about a same height from a top surface of the hetero junction structure;
    the first source/drain electrode further includes a first field plate extending horizontally from a top portion of the first source/drain electrode toward the second source/drain electrode with a first gate disposed on the top surface of the hetero junction structure underneath the first field plate; and
    the second source/drain electrode further includes a second field plate extending horizontally from a top portion of the second source/drain electrode toward the first source/drain electrode with a second gate disposed on the top surface of the hetero junction structure underneath the second field plate wherein the first field plate and the second field plate are extended along substantially a same vertical level but have two different sizes.

2. The HEMT GaN bidirectional blocking device of claim 1 wherein:
    the first field plate has a length represented by $L_{SD-FP1}$ and the second field plate has a length represented by $L_{SD-FP2}$ and wherein $L_{SD-FP1}$ is different from $L_{SD-FP2}$.

3. The HEMT GaN bidirectional blocking device of claim 1 further comprising:
    a sapphire substrate for supporting the hetero junction structure thereon.

4. The HEMT GaN bidirectional blocking device of claim 1 wherein:
the hetero junction structure comprises a gallium nitride (GaN) as the first semiconductor layer interfacing an AlGaN layer as the second semiconductor layer.

5. The HEMT semiconductor power device of claim 1 wherein:
the first semiconductor layer is an N-type gallium nitride layer and the second semiconductor layer is an N-type AlGaN layer dispo ed on top of the gallium nitride layer.

6. The HEMT GaN bidirectional blocking device of claim 1 further comprising:
a GaN buffer layer disposed on top of a bottom substrate for supporting the hetero junction structure thereon.

7. The HEMT GaN bidirectional blocking device of claim 1 wherein:
the first gate and the second gate comprise a first P-type AlGaN gate and a second P-type AlGaN gate.

8. The HEMT GaN bidirectional blocking device of claim 1 wherein:
the first source/drain electrode and the second source, drain electrode are composed of a metal selected from a group of metals consists of Ti, Al, Ni and Au.

9. A method of forming a high electron mobility transistor (HEMT) gallium nitride (GaN) bidirectional blocking device comprising:
forming a hetero junction structure from a first semiconductor layer interfacing a second semiconductor layer having different band gaps to make a two dimensional gas (2DEG) at the hetero junction structure;
forming a first source/drain electrode and second source/drain electrode as two vertical blocks extending upwardly to about a same height from a top surface and at two opposite ends of the hetero junction structure;
forming a first field plate extending horizontally from a top portion of the first source/drain electrode toward the second source/drain electrode and forming a first gate underneath the first field plate on the top surface of the hetero junction structure;
forming a second field plate extending horizontally from a top portion of the second source/drain electrode toward the first source/drain electrode and forming a second gate underneath the second field plate; and
the steps of forming the first field plate and the second field plate further include steps forming form the first and second field plates to extend along substantially a same vertical level but have two different sizes.

10. The method of claim 9 wherein:
the process of forming the first gate and the second gate further comprising a step of forming the first gate and the second gate as P-type AlGaN gates.

11. The method of claim 9 further comprising:
forming a sapphire substrate for supporting the hetero junction structure thereon.

12. The method of claim 9 wherein:
the process of forming the first and the second source/drain electrodes further comprise a step of forming the first source/drain electrode and the second source/drain electrode with a metal selected from a group of metals consists of Ti, Al, Ni and Au.

* * * * *